United States Patent [19]
Takanashi et al.

[11] Patent Number: 5,842,627
[45] Date of Patent: Dec. 1, 1998

[54] SOLDERING APPARATUS AND A METHOD THEREOF

[75] Inventors: Tei Takanashi; Masuru Tan, both of Tokyo, Japan

[73] Assignee: Sony Corporation, Tokyo, Japan

[21] Appl. No.: 721,950

[22] Filed: Oct. 27, 1996

[30] Foreign Application Priority Data

Oct. 2, 1995 [JP] Japan ................................. 7-278442

[51] Int. Cl.[6] .................................................. B23K 31/02
[52] U.S. Cl. ........................ 228/180.1; 228/6.2; 228/46; 228/200; 228/234.1
[58] Field of Search ................. 228/180.1, 200, 228/234.1, 6.2, 40, 46

[56] References Cited

U.S. PATENT DOCUMENTS 4,390,120  6/1983  Broyer ................................. 228/180.1

FOREIGN PATENT DOCUMENTS

| | | |
|---|---|---|
| 0245188 | 11/1987 | European Pat. Off. . |
| 63-310198 | 12/1988 | Japan ................................. 228/180.1 |
| 4-127963 | 4/1992 | Japan ................................. 228/6.2 |
| 1338159 | 11/1973 | United Kingdom . |
| 2072075 | 9/1981 | United Kingdom . |
| 2149708 | 6/1985 | United Kingdom . |
| 2226266 | 6/1990 | United Kingdom . |
| 2241459 | 9/1991 | United Kingdom . |

*Primary Examiner*—Patrick Ryan
*Assistant Examiner*—Jeffrey T. Knapp
*Attorney, Agent, or Firm*—Jay H. Maioli

[57] ABSTRACT

A printed board, to which cream solders are applied on lands at the position where leads of electronic parts are to be soldered and the leads of the electronic parts are provided to the lands, is fed to a soldering position and, the cream solders of the fed printed board are spot heated and melted to solder the leads of the electronic parts to the lands. The molten solders are solidified by forced cooling to fix the leads of the electronic parts to the lands, and the printed board on which the leads of the electronic parts are fixed to the lands with the solidified solders is discharged from the soldering position.

6 Claims, 12 Drawing Sheets

F I G. 9
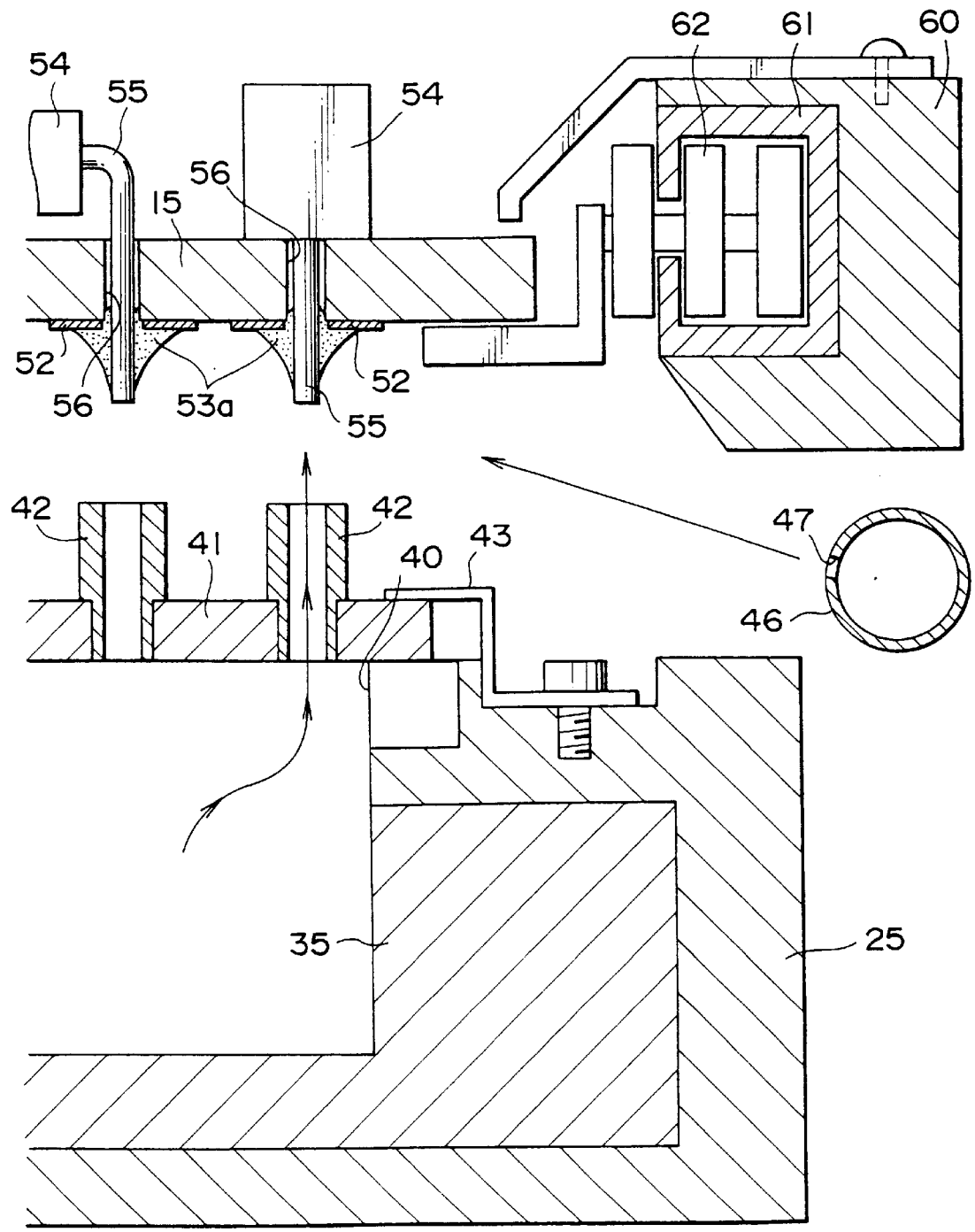

SOLDERING APPARATUS AND A METHOD THEREOF

BACKGROUND OF THE INVENTION

1 Field of the Invention

This invention relates to a soldering apparatus and a method thereof and more particularly to a soldering apparatus and method for what is called as reflow soldering where cream solder is applied on a location to be soldered on a board and the cream solder is melted for soldering.

2 Description of Related Art

For reflow soldering, for example, Japanese Patent Publication Hei 7-73790 published in Japan and corresponding U.S.P. 4,847,465 discloses a soldering apparatus for soldering using cream solder in which parts are mounted on a circuit board and cream solder is applied on soldering position for leads of the parts, the above-mentioned cream solder is melted by hot air spot jet for soldering. According to such soldering apparatus, only soldering positions of a circuit board are heated by the hot air spot jet, therefore soldering is possible without heating the whole board, thus it is possible to protect boards and parts from thermal stress.

It is required for such an apparatus to shorten heating time or conveying time to increase the production capacity. To shorten the time required for conveying a circuit board, the feeding speed of conveying a circuit board to the soldering position and discharging speed after heating should be increased. However, if a circuit board resting for heat treatment at a soldering position is suddenly moved to the discharge conveyer side as the solder is melted or afterwards the speed of the discharge conveyer is changed to a high speed to speed up the discharge speed, the circuit board is vibrated and shocked which often results in relative displacement of parts to the board, slant mounting of parts, or cracking of the solder during changing from melt to solid. These troubles may cause reduced soldering strength.

The present invention is accomplished in view of solving these problems, and provides a reflow soldering in which cream solder applied on a prescribed position on a circuit board is spot heated to melt the solder, and a terminal of electronic parts, namely a lead, is soldered on the prescribed position on the circuit board, wherein the solder is subjected to forced cooling by blowing a gas on the soldering position to solidify rapidly the solder and the circuit board is discharged from the soldering treatment position after the solidification, thus the time from soldering to discharging is shortened and the discharging speed can be fast. Thus, cracking of the solder due to the shortening of the time from soldering to discharging and due to fast discharging speed is prevented by applying the present invention, and the degrading of soldering strength of leads of parts is prevented. It is also assured that the whole time required for soldering process is shortened and the productivity is improved.

SUMMARY OF THE INVENTION

The present invention relates to a soldering apparatus provided with;

a heating means for spot heating a position on a board to be soldered where cream solder is applied previously, and a forced cooling means for cooling molten solder melted by heating using the above-mentioned heating means.

The above-mentioned spot heating means may be a hot air jetting means for spot jetting hot air on a soldering position.

The above-mentioned spot heating means may be structured so that the above-mentioned hot air jetting means is supported movably in the vertical direction by an elevation means and a board comes near to the spot heating means while being elevated position and when hot air is being jetted.

Otherwise, the above-mentioned spot heating means may be provided with a coaxial dual cylinder, the end of the coaxial dual cylinder is directed to a soldering position, hot air is jetted from the inner cylinder and cooling air is jetted from the outer cylinder.

Otherwise, the above-mentioned spot heating means may be provided with a coaxial dual cylinder, the end of the coaxial dual cylinder is directed to a soldering position, the end of an optical fiber is inserted in the inner cylinder and energy light is irradiated on the soldering position through the above-mentioned optical fiber, and cooling air is jetted from the outer cylinder.

The present invention relates to a soldering method in which cream solder applied previously on a soldering position on a board is spot heated by a heating means, and cooling air or gas is fed to cool the solder forcedly while the solder is in a molten condition.

The cooling may be applied after heating using the above-mentioned heating means.

BRIEF DESCRIPTION OF THE DRAWINGS

FIG. 9 is a vertical cross-sectional view of the essential portion for illustrating another embodiment of the present invention.

DETAILED DESCRIPTION OF THE PREFERRED EMBODIMENTS

Figure 1:
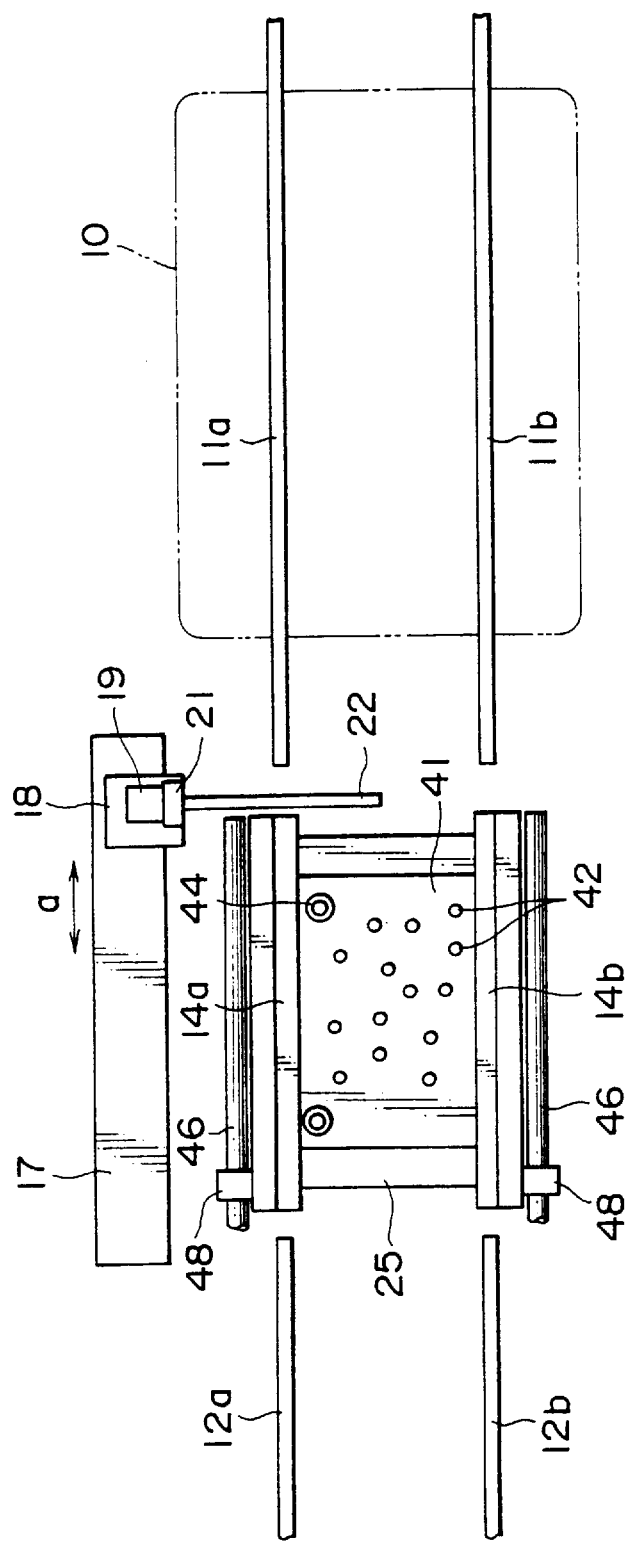
FIG. 1 is a plan view of the essential portion for illustrating the whole structure of a soldering apparatus.
Figure 2:
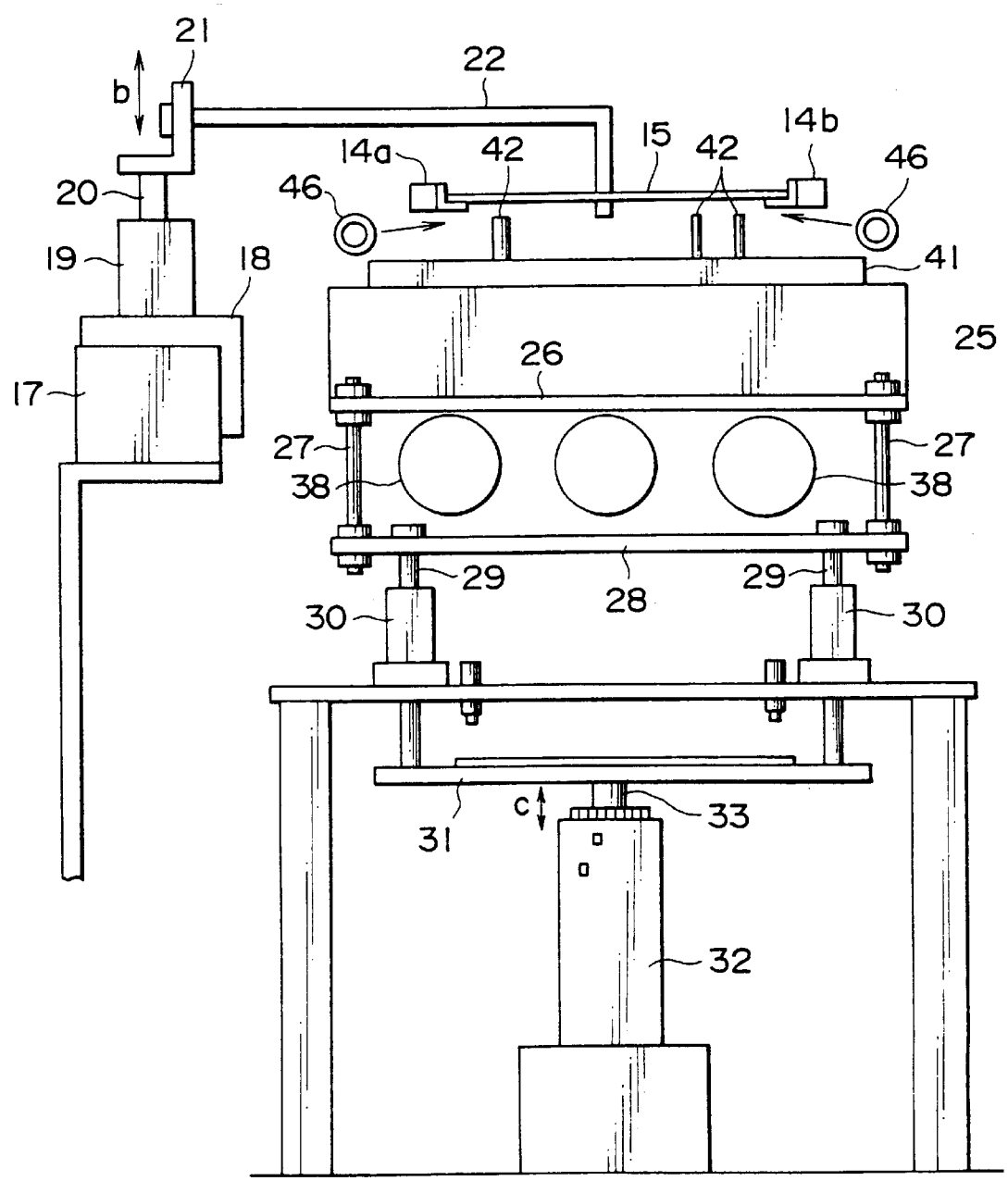
FIG. 2 is a front view of the essential portion of the soldering apparatus.

FIG. 1 to FIG. 8 illustrate a soldering apparatus in accordance with the present invention, as shown in FIG. 1, in the soldering apparatus, a circuit board conveyed by a feeding conveyer 11a and 11b (the circuit board is not shown in FIG. 1) is preheated just before the soldering position by a preheater 10, then transferred to the soldering position, and the circuit board 15 supported by rails 14a and 14b is heated at the soldering position, thereby the circuit board 15 is soldered with reflow solder. The soldered circuit board 15 is discharged by a discharging conveyer 12a and 12b. On the outside of one rail 14a at the soldering position, a rodless cylinder 17 is provided in parallel to the rail 14a. On a mover 18 which is movable in the arrow "a" direction and provided on the rodless cylinder 17, an air cylinder 19 is mounted, and a bracket 21 is fixed on the piston rod 20 of the air cylinder 19. The bracket 21 is movable in the arrow "b" direction as the piston rod 20 moves vertically. An L-shaped arm 22 one end of which arm extends downward at the end is mounted on the bracket 21. The end of the arm 22 is structured so as to push the rear end of the circuit board 15 as shown in FIG. 2, thereby the circuit board 15 is transferred along the rails 14a and 14b.

A surge tank 25 in a form of rectangular box is provided at the position under the circuit board 15 transferred by the rails 14a and 14b. The surge tank 25 is a chamber in which hot air is charged. The surge tank 25 is supported by a plurality of mounting rods 27 with interposition of a mounting plate 26 as shown in FIG. 2. The bottom ends of the mounting rods 27 are fixed on a support plate 28.

A plurality of elevating rods 29 projected downward is provided on the support plate 28. These elevating rods 29 are supported slidably in the vertical direction by respective guide cylinders 30. The bottom ends of the elevating rods 29 are connected to a connecting plate 31. The connecting plate 31 is connected to a piston rod 33 of an elevating air cylinder 32 which piston rod is movable in the arrow "c" direction.

Figure 4:
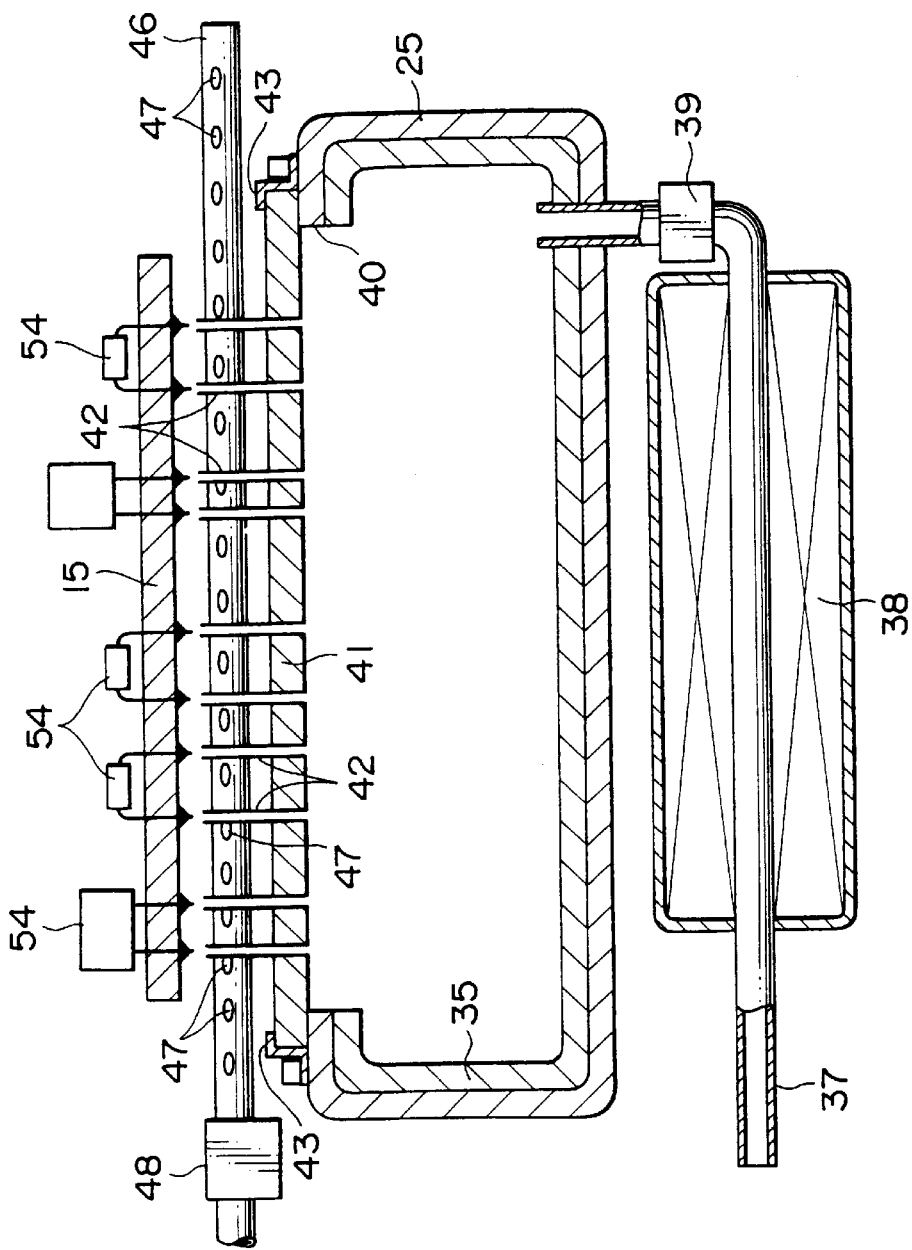
FIG. 4 is a cross-sectional view along the line 4—4 in FIG. 3.
Figure 5:
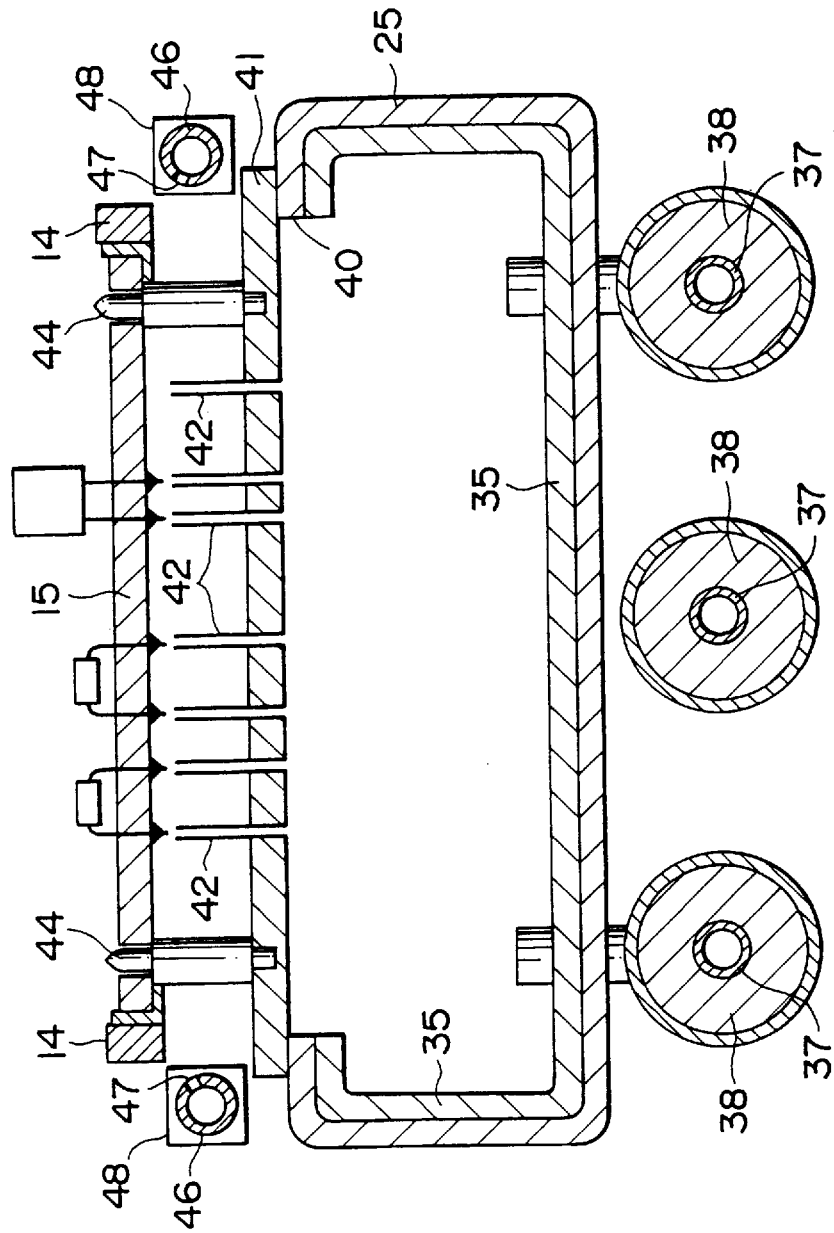
FIG. 5 is a cross-sectional view along the line 5—5 in FIG. 3.

The surge tank 25 which constitutes a chamber has a shape of an approximate rectangular box, the internal is hollow (refer to FIG. 4 and FIG. 5). In the internal of the surge tank 25, an insulating wall 35 is provided. One end of an air pipe 37 is connected to the surge tank 25. A heater 38 is fixed on the air pipe 37, a valve 39 is connected at the end of the air pipe 37.

The top of the surge tank 25 has an open structure 40, and an adapter plate 41 is mounted covering the opening 40. The adapter plate 41 is fixed on the surge tank 25 at the periphery with clamp nails 43. On the adapter plate 41, many hot air jetting pipes 42 are provided. Each hot air jetting pipe 42 comprises a cylinder for jetting hot air to the soldering position respectively. At the side of the adapter plate 41, for example, two positioning pins 44 are fixed for positioning of a circuit board 15.

On the outside of the above-mentioned a pair of rails 14a and 14b and above the both sides of chamber 25, gas jetting pipes 46 are provided on both sides. On these gas jetting pipes 46, a plurality of jetting holes 47 are provided along the longitudinal direction as shown in FIG. 4, gas is jetted from these jetting holes 47 in the direction to the bottom side of the circuit board 15. A valve 48 is connected to the root of each gas jetting pipe 46.

Figure 6:
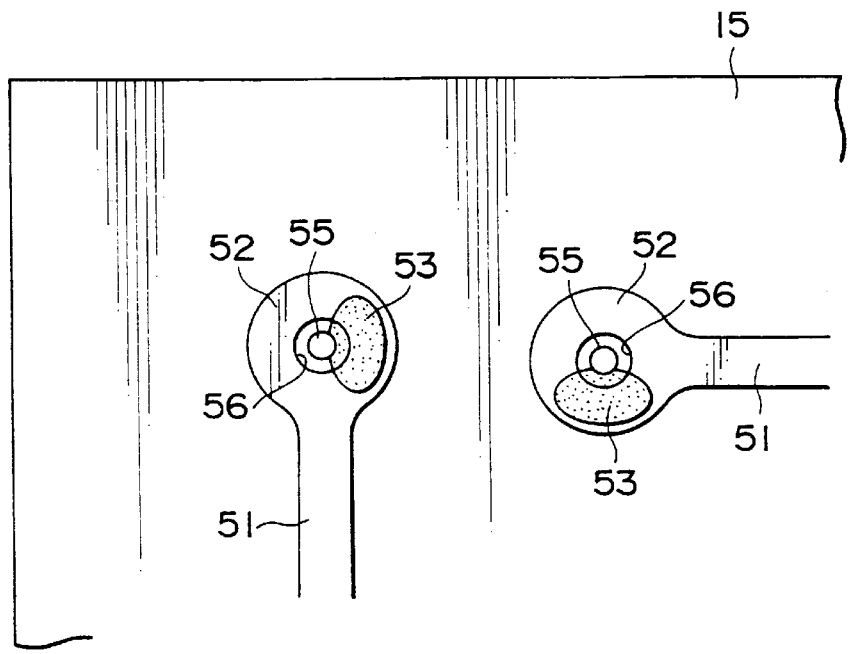
FIG. 6 is an enlarged plan view of the essential portion of a circuit board to be soldered.

On a plurality of positions on the circuit board 15, through holes 56 are provided as shown in FIG. 6, and around these through holes 56, connecting lands 52 are formed, and the connecting lands 52 are connected to wiring patterns 51. On the connecting lands 52, cream solder 53 is applied previously by printing. A lead 55 of an electronic parts 54 is inserted through a through hole 56.

When performing a soldering operation cream, solder 53 is applied on the connecting lands 52 and leads 55 of electronic parts 54 are inserted through the through holes 56, the circuit board 15 is transferred to the position just before the soldering position by feeding conveyers 11a and 11b, the circuit board 15 is preheated in a preheater in which the atmospheric temperature is set to 200° C. to 230° C., and then the circuit board 15 is transferred to the soldering position where the rails 14a and 14b are provided.

The transfer of the circuit board 15 by the feeding conveyers 11a and 11b transfers the circuit board 15 on to the prescribed position of the rails 14a and 14b. Afterward, the piston rod 20 of the air cylinder 19 shown in FIG. 2 is drawn down to pull the arm 22 down, thereby the end of the arm 22 is moved to the rear end of the circuit board 15. In this condition, the mover 18 of the rodless cylinder 17 is moved toward the discharge conveyers 12a and 12b. The end of the arm 22 pushes the rear end of the circuit board 15 toward the discharge conveyers 12a and 12b side along the rails 14a and 14b, and transfers the circuit board 15 to the prescribed position on the rails 14a and 14b.

The surge tank 25 is elevated to approach to the circuit board 15 synchronously with transferring of the circuit board 15 to the soldering position. This operation is operated by the air cylinder 32 shown in FIG. 2, that is, the piston rod 33 of the air cylinder 32 is extruded to elevate the support plate 28 with interposition of connecting plate 31 and elevating rods 29. Thereby, the surge tank 25 supported by the support plate 28 with interposition of the mounting rods 27 is elevated to the soldering position. The position of the end of the hot air jetting pipes 42 on the adapter plate 41 mounted on the surge tank 25 is prescribed to be about 3 mm to 5 mm from the bottom side of the circuit board 15.

Figure 3:
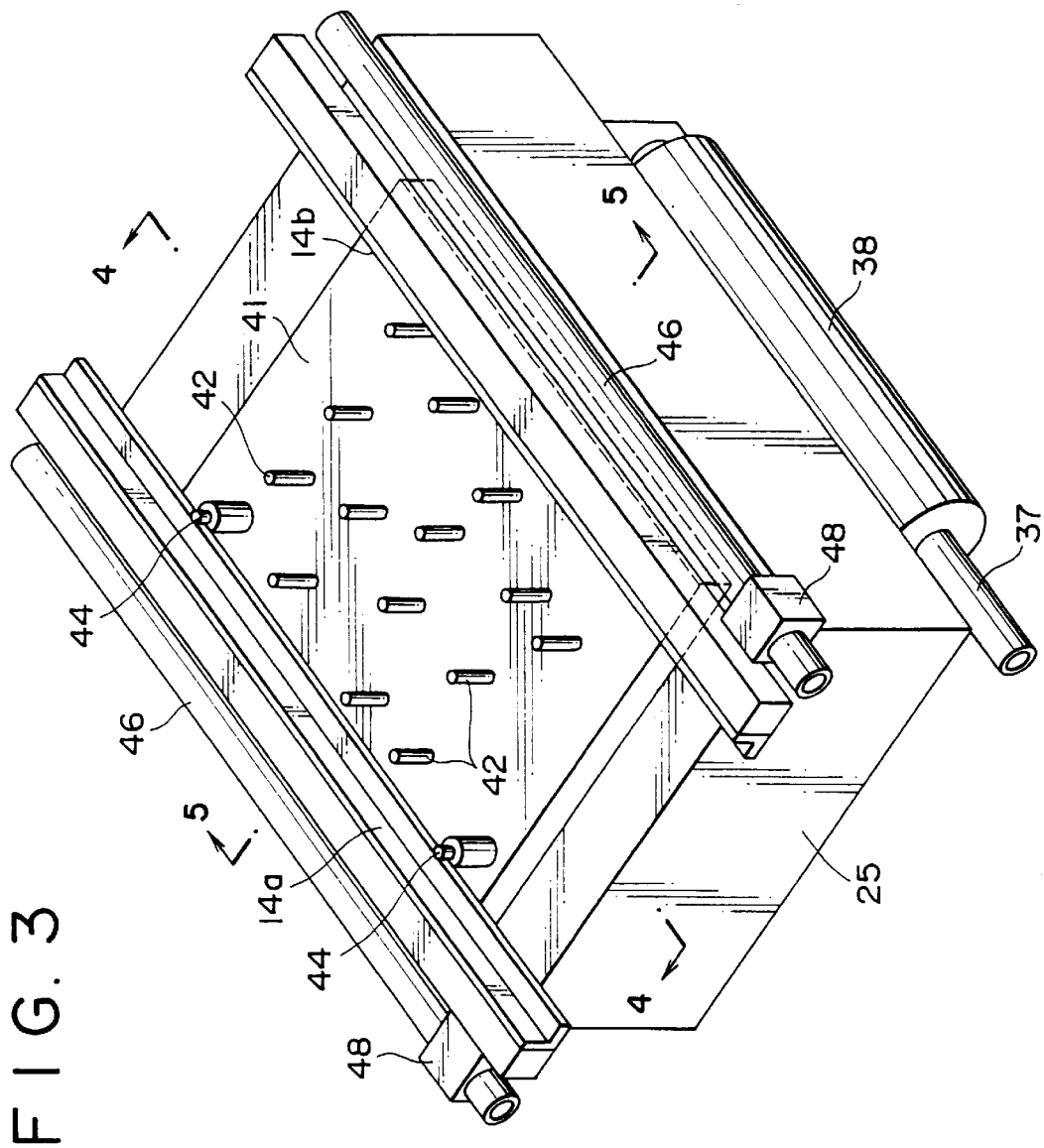
FIG. 3 is a perspective view of the essential portion of the soldering apparatus.

As shown in FIG. 3 and FIG. 5, to set accurately the relative position between the circuit board 15 and hot air pipes 42, the positioning pins 44 with a conical tip are provided on the adapter plate 41. When the surge tank 25 is elevated by the air cylinder 32, the positioning pins 44 of the adapter plate 41 on the surge tank 25 are also elevated and inserted into positioning engaging holes provided previously on the circuit board 15, thereby the relative position between the position of the lands 52 where cream solder 53 is applied and the position of the hot air jetting pipes 42 of the circuit board 15 is positioned accurately.

Figure 7:
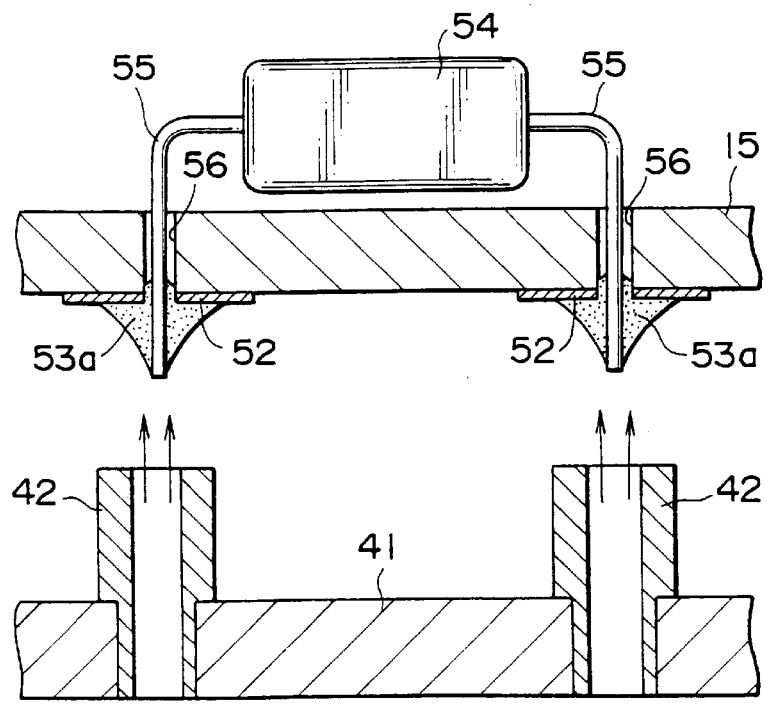
FIG. 7 is an enlarged vertical cross-sectional view of the essential portion for illustrating soldering.

After the positioning, hot air of 350° C. to 360° C. is jetted from the hot air jetting pipes 42 of the adapter plate 41 provided on the top opening 40 of the surge tank 25 to the position of the lands 52 individually. Each hot air jetting pipe 42 is mounted previously on the adapter plate 41 at the position of each land 52, therefore when hot air is jetted from each hot air jetting pipe 42, the cream solder 53 applied on the connecting land 52 on the bottom side of the circuit board 15 is heated to a temperature of 180° C., namely the melting point of solder, or higher, for example, 200° C. to 220° C. Thereby, solder particles in the cream solder 53 are melted, the land 52 and lead 55 are wetted with the solder as shown in FIG. 7, and the solder surrounds the lead 55. Thus the solder 53a connects firmly between the land 52 and lead 55. In other words, the soldering using reflow solder is completed in this process.

After jetting of hot air for a prescribed time from the hot air jetting pipes 42, the valve 39 is closed and the pressure in the surge tank 25 is reduced. Thereby, hot air jetting from the hot air jetting pipes 42 is brought to a stop.

The valves 48 are opened synchronously with the stopping of hot air jetting from the hot air jetting pipes 42, gas is jetted from the jetting holes 47 of the gas jetting pipes 46 toward the circuit board 15, the jetted gas, namely a cooling wind, cools forcedly the molten solder to a temperature below the melting point (180° C.). The gas may be air, and the temperature of the jetted air may be a room temperature, or the jetted gas may be chilled, for example to 0° C. to 5° C., air or gas. In the case of gas, the use of an inert gas such as nitrogen prevents oxidation of the solder surface and eliminates degradation of joint strength due to oxidation. As described herein above, it is possible to cool and solidify rapidly molten solder by jetting gas as described herein above.

The surge tank 25 is moved down synchronously with the above-mentioned stopping of hot air jetting or starting of the forced cooling. The moving down operation is the reverse operation of the above-mentioned elevation operation, that is, the moving down operation is operated by drawing the piston rod 33 of the air cylinder 32. The surge tank 25 is moved to a lower position by this operation.

Figure 8:
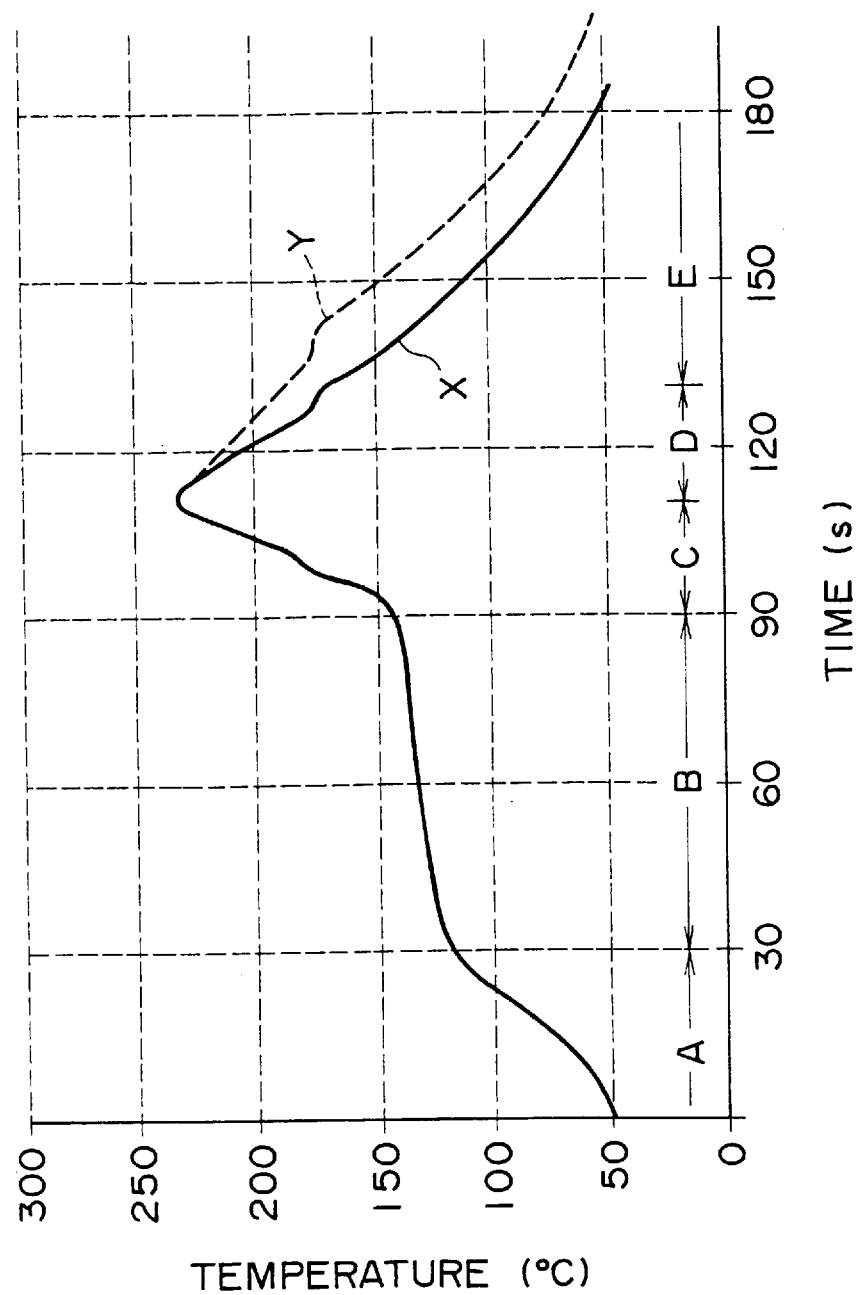
FIG. 8 is a graph for describing change of surface temperature of a circuit board during soldering process.

FIG. 8 shows the temperature change of a portion of a connecting land 52 on the bottom side of the circuit board 15. In this figure, A region shows temperature rising when the land is getting near to the preheater 10. B region shows temperature rising due to heating by the preheater 10. C region shows temperature rising due to hot air jetting for melting solder. D region shows temperature lowering due to forced cooling by gas jetting. E region shows temperature lowering to a room temperature after the forced cooling (that is, the circuit board is ready for transferring to the discharge conveyers 12a and 12b side after E region). In the figure, the solid line curve X represents the temperature lowering when forced cooling is applied by jetting cooling wind and the dotted line curve Y represents the temperature lowering when natural cooling is applied.

This apparatus is advantageous in that after melting of cream solder 53 by hot air, cooling wind is jetted from the jetting holes 47 of the gas jetting pipes 46 for cooling wind, thereby the molten solder is changed rapidly from molten state to solid state, when, the forced cooling using cooling wind continues for about 0.5 to 20 seconds.

After forced cooling, the end of the arm 22 pushes the rear end of the circuit board 15 and, the circuit board 15 on the rails 14a and 14b is transferred to the discharge conveyers 12a and 12b. Solder 53a on the circuit board 15 transferred on the discharge conveyers 12a and 12b is not molten but already solid, therefore the solder 53a will not crack even if the circuit board 15 is vibrated and shocked do to of increased speed of the discharge conveyers 12a and 12b.

Then, after discharging of the circuit board 15, the mover 18, air cylinder 19, piston rod 20, bracket 21, and arm 22 return to the original position shown in FIG. 1.

As described herein above for the embodiment of the present invention, in the soldering apparatus using hot air, immediately after melting of cream solder 53 using hot air, cooling wind is blown from the jetting holes 47 of the gas jetting pipes 46 to the solder surface on the circuit board 15, thereby the solder is solidified rapidly.

Therefore, joints between cream solders 53 and electronic parts 54 will not crack and will not be degraded in joint strength. Further, the forced cooling results in smaller crystal grains of solder compared with slow cooling of molten solder and, the solder of small crystal grains leads to even strength of solder and less change with time of joint strength. Thus high quality soldering is realized.

Next, the second embodiment is described referring to FIG. 9.

The same structures in FIG. 9 as those of the first embodiment are marked with the same numerals and detailed description is omitted.

In the second embodiment, instead of providing the rails 14a and 14b on both sides of the soldering position, a chain conveyer is provided for transferring. In detail as shown in FIG. 9, U-shaped guides 61 are provided on the top and bottom frames 60, a chain conveyer 62 is provided so as to circulate in the U-shaped guide 61. The chain conveyer 62 supports both ends of the circuit board 15. Other structures are almost the same as those of the first embodiment, therefore detailed description is omitted.

According to the structure of the second embodiment, the chain conveyers 62 receive the circuit board 15 fed by the feeding conveyer 11, the circuit board 15 is moved to the discharge conveyers 12 side by the chain conveyers 62 and positioned correctly, hot air is jetted from the hot air jetting pipes 42 of the adapter plate 41 mounted on the top opening 40 of the surge tank 25, thereby it is possible to solder firmly the leads 55 of electronic parts 54 to connecting lands 52 with solders 53a which are molten cream solders 53. After the soldering, it is possible that cooling wind jetted from the jetting holes 47 of the gas jetting pipes 46 cools forcedly the soldering position on the bottom side of the circuit board 15.

Accordingly in such an embodiment as described herein above, the forced cooling of soldering position is possible, thereby the displacement of electronic parts 54 caused from shock due to high speed of transferring and the degrading of joint strength due to cracking on solder are prevented. It is possible to form small crystal grains of solder by forced cooling, thus the quality of soldering is improved.

Figure 10:
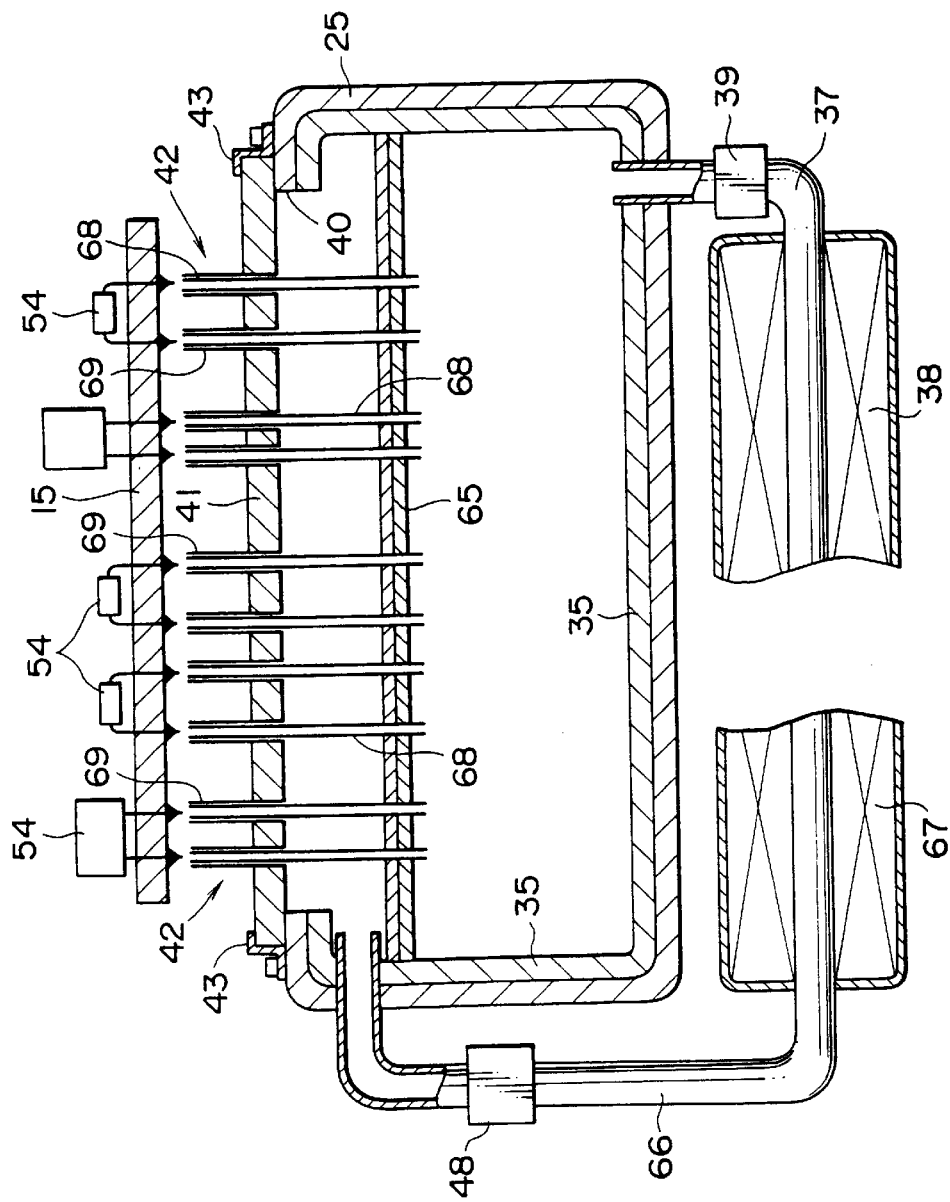
FIG. 10 is a vertical cross-sectional view similar to FIG. 4 for illustrating yet another embodiment of the present invention.
Figure 11:
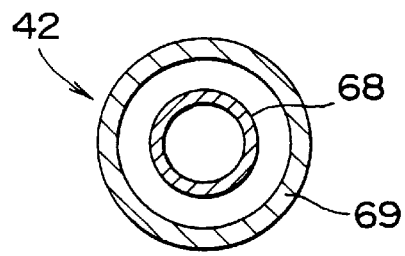
FIG. 11 is an enlarged cross-sectional view of a hot air jetting pipe.
Figure 12:
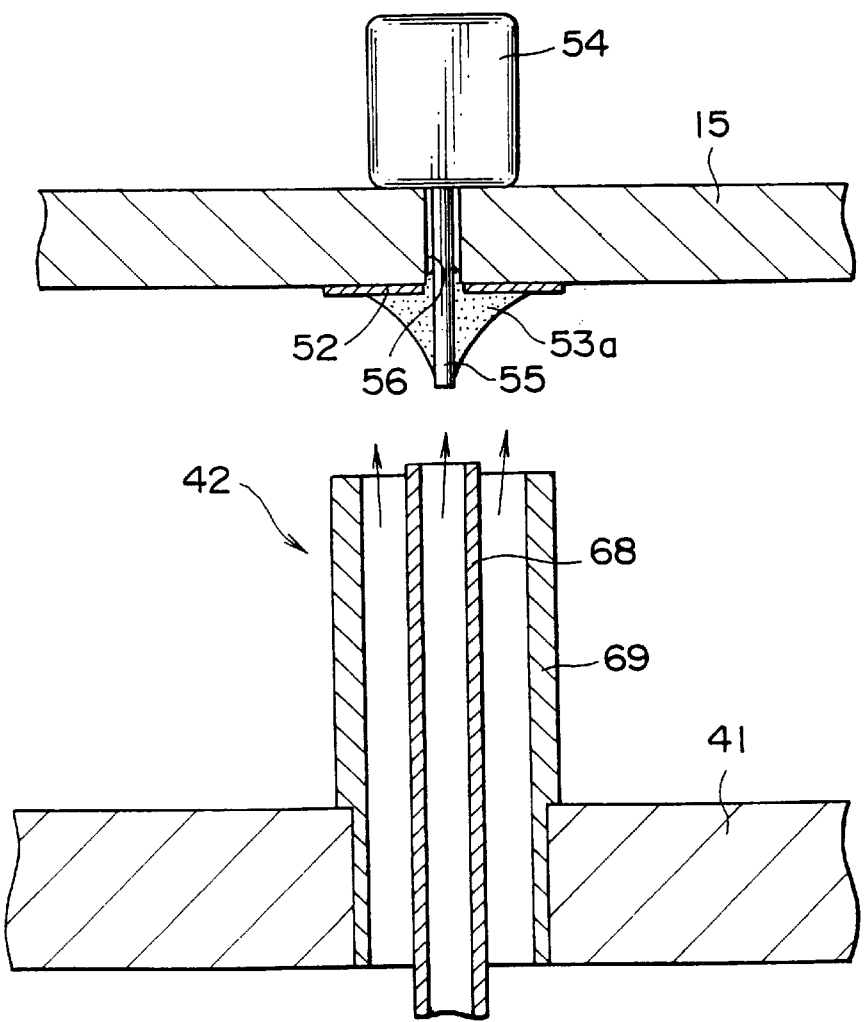
FIG. 12 is an enlarged vertical cross-sectional view of the essential portion for illustrating soldering.

Next, the third embodiment is described referring to FIG. 10 to FIG. 12.

The same structures of the third embodiment shown in FIG. 10 to FIG. 12 as those of the first embodiment are marked with the same numerals, and detailed description is omitted.

In the third embodiment of the present invention, as shown in enlarged views of FIG. 11 and FIG. 12, the hot air pipes 42 of the adapter plate 41 mounted on the top opening 40 of the surge tank 25 are structured with dual coaxial cylinders comprising the inner cylinder 68 and outer cylinder 69, hot air is jetted from the inner cylinders 68 and gas is jetted from the outer cylinders 69.

In this case, the surge tank 25 is partitioned at the intermediate position in the height with an thermal insulation partition wall 65 as shown in FIG. 10, the space under the partition wall 65 is fed with heated air heated by the heater 38 through the air pipe 37. The inner cylinders 68 extend downward through the partition wall 65 so that the space under the partition wall 65 communicates to the inner cylinders 68.

On the other hand, the upper space of the partition wall 65 is connected to the air pipe 66. The air pipe 66 is provided with a cooling unit 67, the cooling unit provides cooled gas, namely cooling wind. For switching between feeding and shutting off, a valve 48 is connected to the air pipe 66. The upper space of the partition wall 65 communicates to the outer cylinders 69.

The structures of the third embodiment other than those shown in FIG. 10 to FIG. 12 are almost the same as those of the first embodiment, therefore detailed description is omitted.

In this structure, when the circuit board 15 is transferred above the surge tank 25, the surge tank 25 is elevated by the elevation mechanism, first the valve 39 is opened, hot air is fed to the lower space of the partition wall 65 through the air pipe 37. As the pressure in the lower space of the partition wall 65 increases, hot air is jetted through the inner cylinders 68 of the hot air jetting pipes 42, and cream solders 53 applied on the circuit board 15 are heated and melted. The temperature of the hot air may be the same as that in the first embodiment, hot air of 350° to 360° C. is jetted to heat the cream solders 53 at 200° to 220° C., thereby melting the solder.

After the completion of melting of the solders by hot air, the valve 39 is closed and the valve 48 is opened synchronously with the closing of the valve 39, gas cooled by the cooling unit 67 is fed to the upper space of the partition wall 65. As the pressure in the upper space of the partition wall 65 increases, cooled gas is jetted to the soldering positions through the outer cylinders 69, the molten solders are cooled forcedly. By applying such an embodiment, the same effect as that of embodiments described hereinbefore is obtained.

Figure 13:
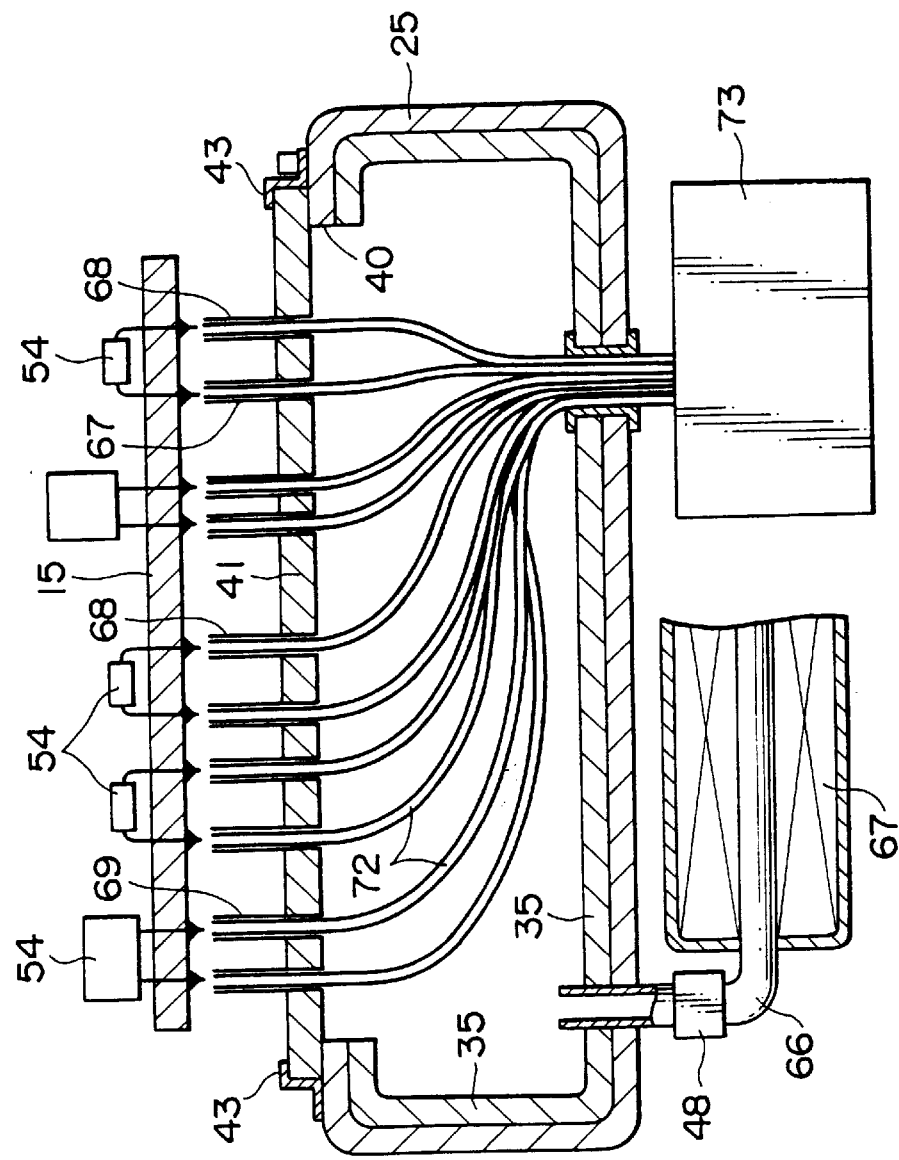
FIG. 13 is a cross-sectional view similar to FIG. 4 for illustrating yet another embodiment of the present invention.
Figure 14:
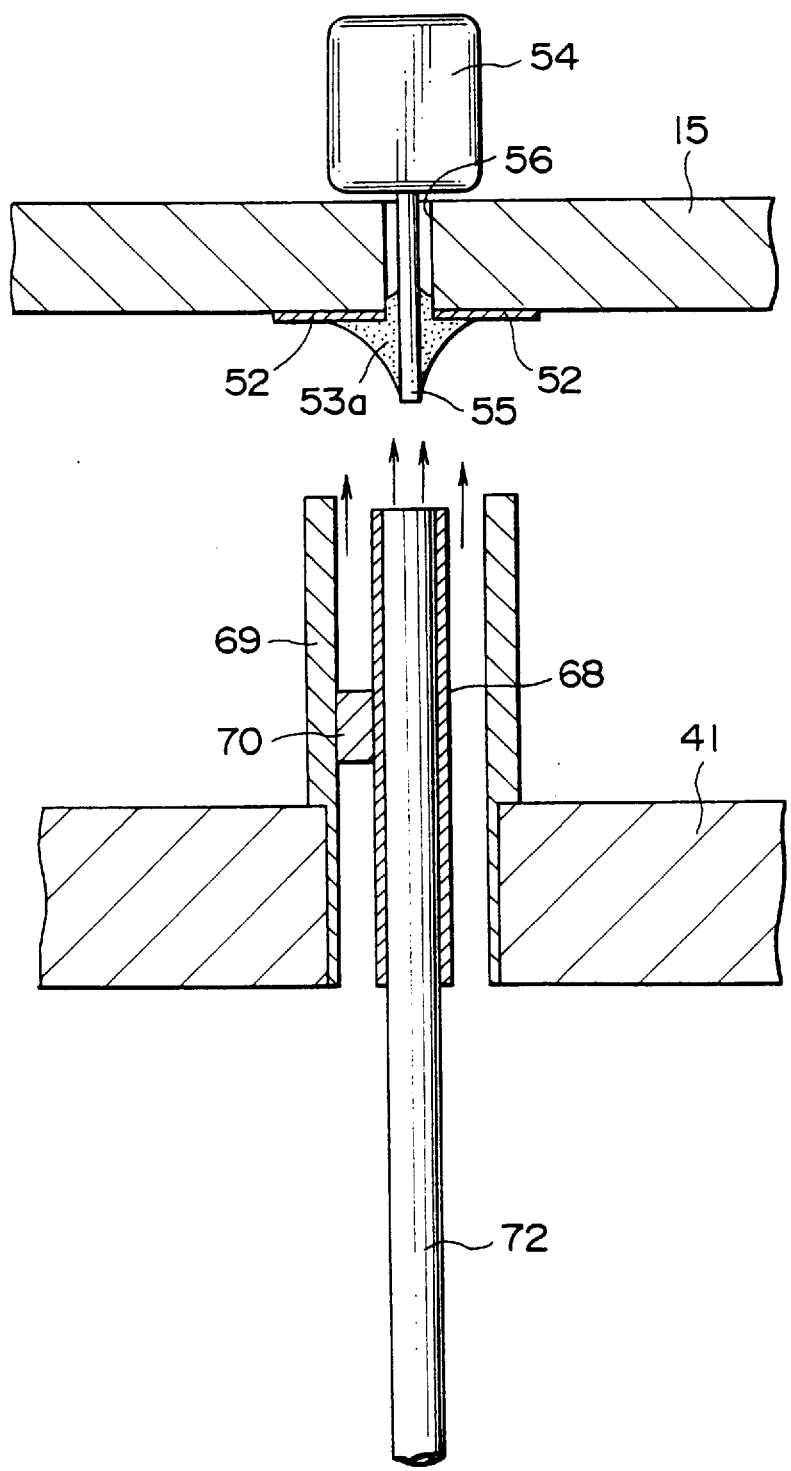
FIG. 14 is an enlarged vertical cross-sectional view of the essential portion for illustrating soldering.

The fourth embodiment is described referring to FIG. 13 and FIG. 14.

The same structures of the fourth embodiment shown in FIG. 13 and FIG. 14 as those of the first embodiment are marked with the same numerals as those of the first embodiment, and detailed description is omitted.

In the fourth embodiment of the present invention, instead of hot air for melting cream solders 53, a laser beam is irradiated. In detail, in this embodiment as shown in an enlarged drawing of FIG. 14, the end of an optical fiber 72 for irradiating a laser beam is inserted in the inner cylinder 68 located inside the outer cylinder 69, and the other end of the optical fiber 72 is connected to a laser beam generator 73 provided under the surge tank 25 shown in FIG. 13, and a high power laser beam generated from the laser beam generator 73 is guided through the optical fiber 72. The numeral 70 represents a support provided on the inside wall of the outer cylinder 69 for supporting the inner cylinder 68 by means of the outer cylinder 69.

In this embodiment, the surge tank 25 is used for only feeding cooling wind. In detail, the air pipe 66 provided with the cooling unit 67 is connected to the surge tank 25, and the space of the internal of the surge tank 25 communicates to the outer cylinders 69.

Therefore in this case, the surge tank 25 is elevated to the soldering position by the elevation mechanism, and the high power laser beam generated by the laser beam generator 73 is irradiated to the cream solders 53 applied on the connecting lands 52 of the circuit board 15 through the optical fibers 72. Thereby, the cream solders 53 are spot melted. When the cream solders 53 are melted completely, irradiation of the laser beam through the optical fibers 72 is brought to a stop, and the valve 48 is opened simultaneously, then the pressure in the surge tank 25 is increased to jet cooling wind from the outer cylinders 69 to the molten solders on the connecting lands 52, thus molten solders are cooled forcedly.

The structures of the fourth embodiment other than those shown in FIG. 13 and FIG. 14 are almost the same as those of the first embodiment, therefore detailed description is omitted.

In this embodiment of the present invention, because a laser beam is used for melting cream solder 53, cooling wind may be jetted continuously from the outer cylinders 69 during irradiation of laser beam. The energy source for melting solder is not limited to a laser beam, but other energy light such as halogen light may be irradiated for melting cream solder 53.

In all embodiments described hereinbefore, the surge tank 25 is moved vertically by the air cylinder 32, and the surge tank 25 is moved upward for soldering. However, such elevation mechanism is not necessarily required and may be omitted depending on the case.

There are projections on the bottom side of the circuit board 15 which are formed by soldering of leads 55 of electronic parts 54 on the bottom side where the connecting lands 52 are formed for soldering, if the height of these projections is lower than 3 to 5 mm from the bottom surface of the circuit board 15, the elevated position of the hot air jetting pipes 42 of the adapter plate 41 does not disturb the transfer of the circuit board 15.

In the case that cooling wind is jetted in the horizontal direction from the cooling wind jetting holes 47 of the cooling wind jetting pipes 46 as in the first embodiment and second embodiment, the hot air jetting pipes 42 rising up on the adapter plate 41 can disturb the flow of the cooling wind, therefore it is preferable that the adapter plate 41 having the hot air jetting pipes 42 is moved down, on the other hand, in the case that cooling wind is jetted from the outer cylinders 69 of the dual cylinder type hot air jetting pipes 42 as shown in the third embodiment, and in the case that cooling wind is jetted from the outer cylinders 69 of the pipes having the inner cylinders 68 through which optical fibers 72 are inserted as shown in the fourth embodiment, it is not necessary that the surge tank 25 is moved down, therefore an apparatus does not need a mechanism for moving vertically unless the adapter plate 41 disturbs transfer of the circuit board 15, and the adapter plate 41 may be fixed.

If the surge tank 25 is fixed, the time required for vertical motion is eliminated, thereby the cooling time is shortened to improve the productivity. Otherwise, a switch is provided on the apparatus, and the operation mode may be selected by switching between the movable mode for moving vertically the surge tank 25 and the fixed mode.

As described hereinbefore, the present invention relates to a soldering apparatus provided with a heating means for spot heating the position which is the soldering position and on which position cream solder is previously applied, and a cooling means for cooling forcedly the molten solder heated by the heating means. Also, the present invention relates to a soldering method in which cream solder applied previously on the soldering position of the board is spot heated by a heating means and cooling air or gas is fed to the molten solder to cool forcedly the solder.

According to the present invention, it is possible to solder a minimized heating load to boards and parts, and the forced cooling of molten solder allows the time required for solidifying to be shortened, and thus the productivity is improved. The forced cooling results in fine crystalline structure of solder thus the quality of soldering is improved.

What is claimed:

1. A reflow soldering method comprising the steps of:
   feeding to a soldering position a printed board to which cream solders are applied on lands at position where leads of electronic aparts are provided for soldering thereto,
   spot heating and melting said cream solders on said printed board fed to the soldering position,
   soldering said leads of said electronic parts of said lands,
   solidifying thereafter the molten solders by forced cooling, and
   discharging said printed board on which said leads of said electronic parts are fixed to said lands with the solidified solders from said soldering position.

2. A reflow soldering apparatus comprising:
   feeding means for feeding to a soldering position a printed board having cream solders applied on lands thereof at positions where leads of electronic parts are provided for soldering thereto,
   means for spot heating said cream solders of said printed board fed by said feeding means to said soldering position and for melting said cream solders to solder the leads of said electronic parts on said lands, forced cooling means for cooling and solidifying molten solders at said lands on said printed board, and discharge means for discharging said printed board on which the leads of said electronic parts are soldered to said lands with solidified solders.

3. The reflow soldering apparatus as claimed in claim 2, wherein said means for spot heating comprises hot air jetting means for jetting hot air from ducts formed therein provided at positions corresponding to said lands applied with said cream solder at the positions where said leads of said leads of said electronic parts are soldered when said printed board is a at said soldering position.

4. The reflow soldering apparatus as claimed in claim 2, wherein said means for spot heating comprises optical heating means for heating optically by energy light emitted from ends of optical fibers provided at positions corresponding to said lands applied with said cream solder at the positions where said leads of said electronic parts are when said printed board is at said soldering positions.

5. The reflow soldering apparatus as claimed in claim 2, wherein said means for spot heating comprises one of hot air ducts or optical fibers for emitting light energy facing to said lands applied with said cream solder at the positions where said leads of said electronic parts are soldered when said printed board is at said soldering position, and said forced cooling means comprises gas jetting ducts provided adjacent to said one of said hot air ducts or optical fibers.

6. The reflow soldering apparatus as claimed in claim 5, wherein said gas jetting ducts are cylindrical and are arranged surrounding said one of said hot air ducts or optical fibers and outside the peripheries of said hot air ducts or optical fibers forming said means for spot heating.

* * * * *